United States Patent [19]

Morie et al.

[11] Patent Number: 4,786,954
[45] Date of Patent: Nov. 22, 1988

[54] DYNAMIC RAM CELL WITH TRENCH SURROUNDED SWITCHING ELEMENT

[75] Inventors: Takashi Morie; Kazushige Minegishi; Shigeru Nakajima, all of Kanagawa, Japan

[73] Assignee: Nippon Telegraph & Telephone Public Corporation, Tokyo, Japan

[21] Appl. No.: 110,616

[22] Filed: Oct. 19, 1987

Related U.S. Application Data

[63] Continuation of Ser. No. 716,370, Mar. 26, 1985, abandoned.

[30] Foreign Application Priority Data

Apr. 19, 1984 [JP] Japan .................................. 59-79683
Oct. 8, 1984 [JP] Japan ................................ 59-209789

[51] Int. Cl.[4] ........................................... H01L 29/78
[52] U.S. Cl. ..................... 357/23.6; 357/41; 357/45; 357/54; 357/55; 357/59; 365/149
[58] Field of Search ................... 357/23.6, 55, 54, 59, 357/41, 45; 365/149

[56] References Cited

FOREIGN PATENT DOCUMENTS

| 56-43171 | 4/1981 | Japan . | |
| 59-191374 | 10/1984 | Japan ................................. | 357/23.6 |
| 2138207 | 10/1984 | United Kingdom ............... | 357/23.6 |
| 81/03241 | 11/1981 | World Int. Prop. O. .......... | 357/23.6 |

OTHER PUBLICATIONS

N. Lu, "High-Capacitance D-RAM Cell Using Buried Polysilicon ...," IBM Tech. Discl. Bull., vol. 26, #3B, Aug. 1983, pp. 1318-1322.

"Depletion Trench Capacitor Technology for Megabit Level MOS dRAM" by T. Morie, K. Minegishi and S. Nakajima, IEEE Electron Device Letters, vol. EDL-4, No. 11, Nov. 1983.

"A Corrugated Capacitor (ell CCC) for Megabit Dynamic MOS Memories" by H. Sunami et al., IEEE Electron Device Letters, vol. EDL-4, No. 4, Apr. 1983, pp. 90-91.

"A Submicron CMOS Megabit Level RAM Technology Using Doped Face Trench Capacitor Cell" by K. Minegishi et al., reprinted from Proceedings of The IEEE International Electron Devices Meeting, Dec. 1983, pp. 319-322.

Primary Examiner—Joseph E. Clawson, Jr.
Attorney, Agent, or Firm—Blakely, Sokoloff, Taylor & Zafman

[57] ABSTRACT

A semiconductor memory device has a semiconductor substrate of one conductivity type in which a plurality of memory cells are formed, each of the plurality of memory cells including at least one capacitor and having a trench which is formed from one major surface of the semiconductor substrate so as to surround at least one memory cell, wherein a first insulating film having element isolation properties is formed on a bottom and most areas of side wall surfaces of the trench, a first conductive film serving as one electrode of the capacitor is formed on the side wall of the first insulating film and an exposed portion of the semiconductor substrate which is not covered with the first insulating film, a second insulating film is formed on the first conductive film, and a second conductive film serving as the other electrode of the capacitor is formed on the second insulating film.

12 Claims, 20 Drawing Sheets

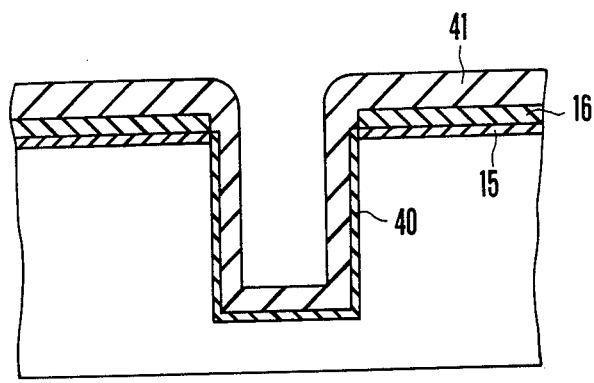
F I G. 7A
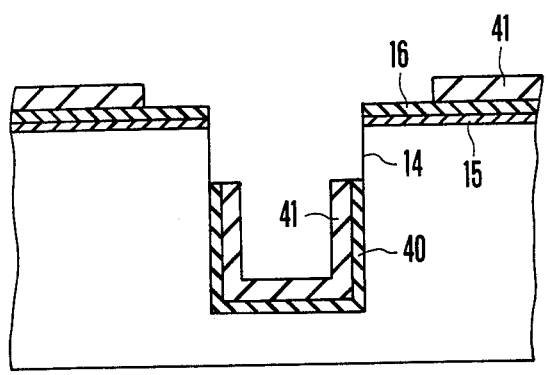
F I G. 7B
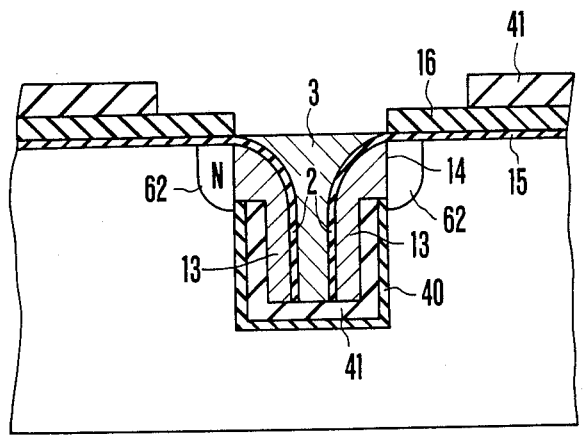
F I G. 7C

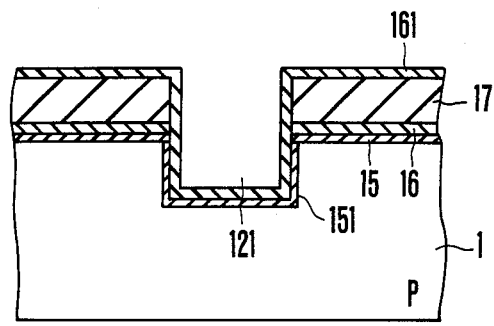
F I G. 8A
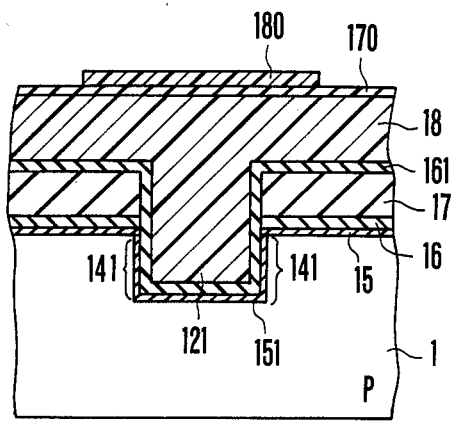
F I G. 8B
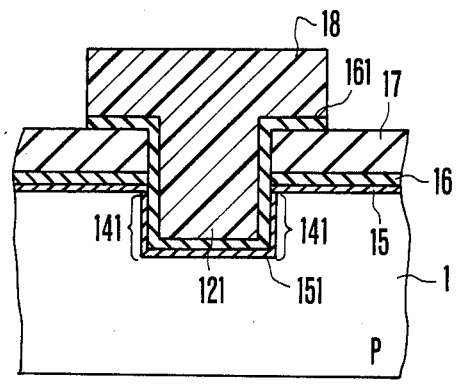
F I G. 8C

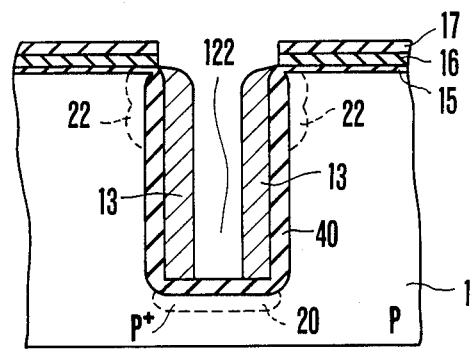
F I G. 19A-2
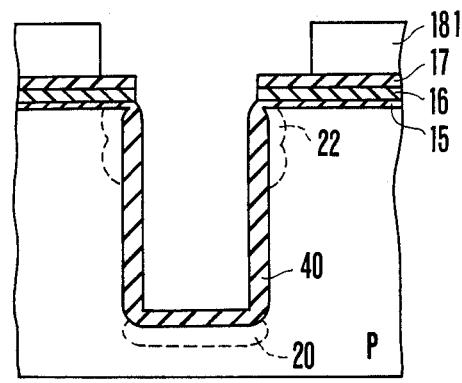
F I G. 19B-1
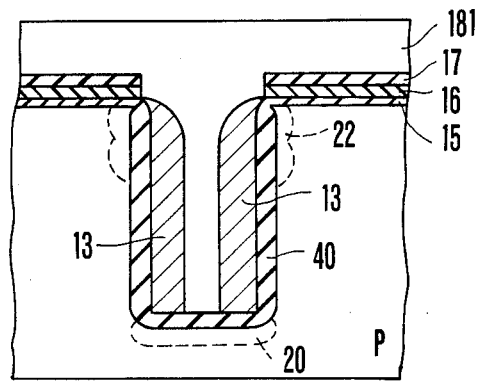
F I G. 19B-2

DYNAMIC RAM CELL WITH TRENCH SURROUNDED SWITCHING ELEMENT

This is a continuation of application Ser. No. 716,370 filed Mar. 26, 1985 now abandoned.

BACKGROUND OF THE INVENTION

The present invention relates to a semiconductor memory device and a method of manufacturing the same.

A currently most advanced random access memory (RAM) is exemplified by dynamic RAMs (to be referred to as 1Tr type dRAMs hereinafter) each having a cell structure consisting of one transistor and one capacitor. Among the 1Tr type dRAMs, a memory cell structure, in that one bit line contact hole is commonly used for two adjacent cells is most advantageous for increasing the packing density of cells. This 1Tr type dRAM is widely employed.

A typical example is illustrated in FIGS. 1 and 2.

The following description will be made for n-channel MIS dRAMs of the prior art and the present invention. However, a p-channel MIS dRAM can also be prepared in the same manner as in the n-channel MOS dRAM by reversing the conductivity type of the silicon substrate, diffusion layers and a channel stopper and the polarity of the applied voltage. When an epitaxial layer or a well region is formed on a bulk semiconductor substrate, the epitaxial layer or the well region should be treated as the silicon substrate having the same polarity as that of the epitaxial layer or the well region.

Referring to FIG. 1, a region surrounded by a broken line represents a memory cell having one capacitor and one MIS transistor.

As shown in FIG. 2, the capacitor comprises a p-type silicon substrate 1, a thin insulating film 2 and a thin conductive layer 3. The thin insulating film 2 comprises: a silicon oxide film of 100 to 500 Å thickness obtained by thermally oxidizing the silicon substrate; a two-layer structure having a thermal oxide film and a silicon nitride film deposited by chemical vapor deposition (to be referred to as CVD hereinafter); or the like. The thin conductive layer 3 comprises phosphorus-doped polysilicon having a low electrical resistance, or a metal (e.g., molybdenum or aluminum).

A silicon oxide film 4 of 0.2 to 1.0 μm thickness and a channel stopper region 5 are formed around a pair of adjacent memory cells having a common contact hole 11 to be described later, thereby isolating the memory cells.

A MIS transistor serving as a transfer gate adjacent to the capacitor has n+-type diffusion layers 6 as source and drains, a gate insulating film 7 and a gate electrode 8 (i.e., a word line). A bit line 10 is connected to the n+-type diffusion layers 6 through the contact hole 11 formed in an insulating interlayer 9.

A positive voltage is applied to the thin conductive layer 3 of the capacitor with respect to the silicon substrate 1, and an n-type inversion layer is formed in the surface layer of the silicon substrate 1 below the thin insulating film 2, so that the capacitor can be charged through the MIS transistor. Charge accumulation can also be performed such that phosphorus is ion-implanted in the silicon substrate below the thin insulating film 2 to form an n-type conductive layer (not shown) instead of forming the n-type inversion layer.

In order to obtain a high-density 1Tr type dRAM, the memory cell area must be minimized. However, reduction of the memory cell area by the conventional method is difficult for the following various reasons.

Since a bird's beak is formed in the element isolation region in accordance with conventional selective oxidation, an element isolation width of about 1 μm or less can hardly be achieved. In addition, when the memory cell area is reduced by conventional techniques, the capacitor area is also reduced. The capacitance of the capacitor and its storable charge are decreased to result in a decrease in output signal voltage and a soft error immunity. However, if the thickness of the thin insulating film 2 is decreased so as to increase the capacitance of the capacitor, the breakdown voltage is decreased. As a result, the operating voltage must be reduced and then the operating margins are reduced.

In order to resolve this problem, a trench capacitor structure has been proposed wherein a trench is formed in the surface layer of the silicon substrate to comprise a capacitor, as described in Technical Digest of International Electron Devices Meeting, pp. 319–322, 1983.

According to the above reference, a thin insulating film corresponding to the thin insulating film 2 is formed in a trench, and a thin conductive layer corresponding to the thin conductive layer 3 is filled in the trench. The effective capacitor area is increased without increasing the area of the capacitor on the substrate.

When a distance between adjacent trenches is shortened in the trench capacitor structure, a punchthrough occurs to shift the charge through the silicon substrate under the oxide film 4 and the channel stopper region 5. This phenomenon is called an intercell interference, which causes storage data loss. Therefore, miniaturizing and the packing density of the memory cells are limited.

SUMMARY OF THE INVENTION

It is, therefore, an object of the present invention to provide a semiconductor memory device and a method of manufacturing the same, wherein further miniaturizing and high packing density of memory cells can be achieved.

It is another object of the present invention to provide a semiconductor memory device and a method of manufacturing the same, wherein adjacent memory cells can be located close to each other and punchthrough phenomenon does not occur, i.e., charge shift caused by the punchthrough phenomenon does not occur, as compared with the conventional device.

It is still another object of the present invention to provide a semiconductor memory device and a method of manufacturing the same, wherein an alignment margin between a gate electrode of a transistor formed together with the capacitor and a contact hole can be increased, and the manufacturing process can be simplified.

It is still another object of the present invention to provide a semiconductor memory device and a method of manufacturing the same, wherein a transistor region formed together with the capacitor region can also be decreased as compared with the conventional device.

In order to achieve the above object of the present invention, there is provided a semiconductor memory device comprising a semiconductor substrate of one conductivity type in which a plurality of memory cells are formed, each of the plurality of memory cells including at least one capacitor and one switching element and having a trench which is formed from one major surface of the semiconductor substrate so as to surround one or a pair of memory cell(s), wherein a first insulating film having element isolation properties is formed at least on most areas of side wall surfaces of the trench, the first insulating film has a window near the opening of the trench so that a portion of the substrate is exposed, a diffusion region is formed in a portion of the substrate corresponding to the window, a first conductive film serving as one electrode of the capacitor is formed on the first insulating film and an exposed portion, which corresponds to the window, of the semiconductor substrate which is not covered with the first insulating film, each conductive film on the side wall of the trench is separated at the bottom of the trench, a second insulating film is formed on the first conductive film, a second conductive film serving as the othe electrode of the capacitor is formed on the second insulating film, and one terminal of the switching element connects to the first conductive film through the window.

According to another aspect of the present invention, there is provided a method of manufacturing a semiconductor memory device, including the steps of:

forming a trench from one major surface of a semiconductor substrate with one conductivity type to a predetermined depth so as to surround active region;

forming a first insulating film on side wall surfaces and a bottom of the trench forming a window in the first insulating film at an upper portion of the side wall surfaces of the trench so as to expose a portion of the substrate;

forming a diffusion region in the side wall through the window and forming a first conductive film on an exposed portion of the semiconductor substrate in the trench and on the first insulating film excluding a predetermined region at a bottom of the trench, the first conductive film serving as one electrode of a capacitor;

forming a second insulating film on the first conductive film formed in the trench;

forming a second conductive film on the second insulating film so as to bury a remaining trench, the second conductive film serving as the other electrode of the capacitor;

forming a third insulating film on the second conductive film; and forming a switching element in the active region so that one terminal of the switching element connects to the diffusion region.

BRIEF DESCRIPTION OF THE DRAWINGS

FIGS. 7A to 7C are respectively sectional views for explaining the steps in manufacturing a modification of an insulating film formed on surfaces of the trench;

FIGS. 8A to 8F are respectively sectional views showing a modification of forming a window for connecting a capacitor electrode and a diffusion layer in an upper portion of the side walls of the trench;

FIGS. 13A, 13B-1, 13B-2 and 14 are respectively sectional views showing another modification of forming a channel stopper;

FIGS. 19A-1 to 19B-1 are respectively sectional views for explaining the steps in manufacturing the device shown in FIG. 16.

DESCRIPTION OF THE PREFERRED EMBODIMENTS

Figure 3A:
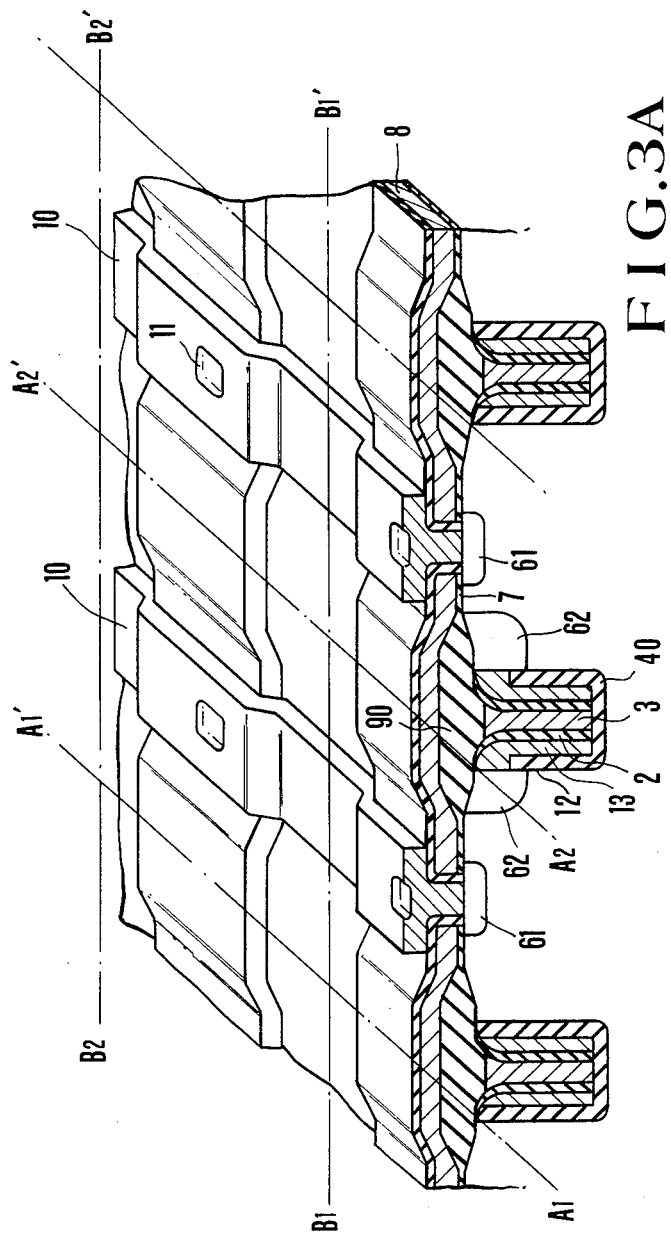
FIG. 3A is a perspective view of a semiconductor memory device according to an embodiment of the present invention.
Figure 3B:
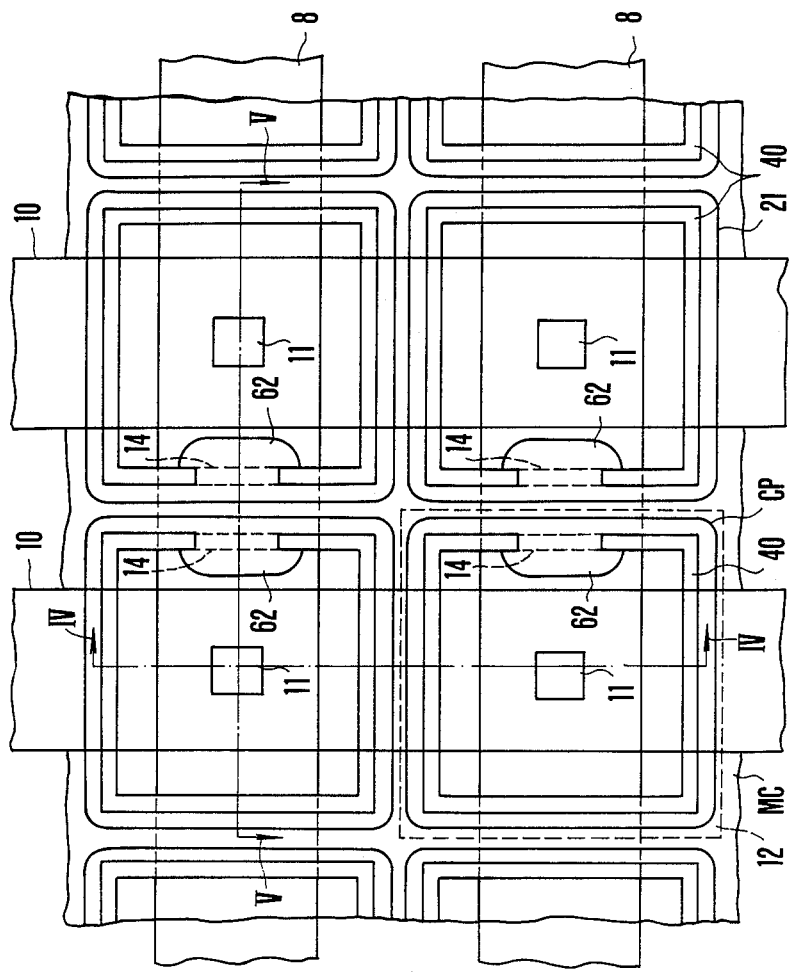
FIG. 3B is a plane view showing a simplified structure of the semiconductor memory device according to the embodiment of the present invention.
Figure 4:
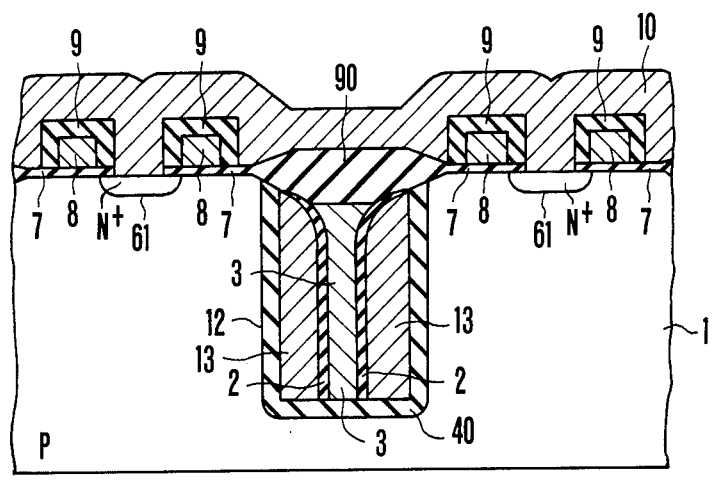
FIG. 4 is a sectional view of the device taken along the line IV—IV of FIG. 3B.
Figure 5:
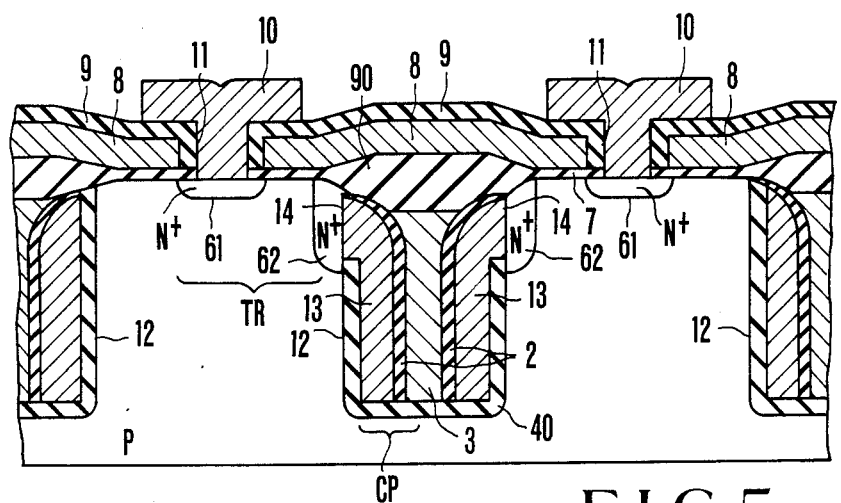
FIG. 5 is a sectional view of the device taken along the line V—V of FIG. 3B.

FIGS. 3A, 3B to 5 show a semiconductor memory device according to an embodiment of the present invention. The same reference numerals as in FIGS. 3A to 5 denote the same parts as in FIG. 1. It should be noted that FIG. 3B shows a planar configuration of the semiconductor memory device, and the vertical positional relationship between the respective elements are not strictly illustrated.

FIG. 3A is a perspective view of a semiconductor memory device according to an embodiment of the present invention. A region surrounded by A1A1'-A2A2'- B1B1'-B2B2' represents one memory cell MC. This semiconductor memory device will be described in detail with reference to FIGS. 3B, 4 and 5.

Referring to FIG. 3B, one memory cell is defined by a region MC surrounded by a broken line. A capacitor region CP constituting the memory cell and an element isolation region are formed around the region MC. A trench 12 is formed to surround each memory cell in one major surface of the semiconductor substrate 1. A silicon oxide film 40 serving as an element isolation film is formed in the inner surface of the trench 12, thereby isolating the adjacent memory cells.

An n-type thin silicon film 13 is formed as one electrode of the capacitor CP on a portion (i.e., a window as part of the semiconductor substrate 1) which is not of the trench 12 and on the side wall of the silicon oxide film 40. A thin insulating film 2 such as a silicon oxide film is formed on the thin film 13. A thin conductive layer 3 serving as the other electrode of the capacitor CP is formed on the thin insulating film 2. A MIS type field effect transistor TR is formed in a region of the semiconductor substrate 1 which is surrounded by the trench. The transistor TR comprises n+-type diffusion layers 61 and 62 serving as drain and source or source and drain thereof, a gate insulating film 7 and a gate electrode 8 serving as one (i.e., a word line) of memory cell selection lines formed in a matrix form.

The n+-type diffusion layer 62 is formed on a surface portion as a window 14 of a silicon substrate 1. The window 14 is obtained by partially removing the silicon oxide film 40 from the side wall surface of the trench 12. The n+-type diffusion layer 62 is electrically connected to the thin n-type silicon film as one electrode of the capacitor CP.

The n+-type diffusion layer 61 is connected through a contact hole 11 to a bit line 10 as the other type of memory cell selection lines formed in the matrix form.

The bit line 10 is electrically insulated from the word line (the gate electrode) 8 through an insulatng interlayer 9.

The word line 8 is electrically insulated from the thin conductive layer as the other electrode of the capacitor CP through a thin insulating film 90 formed at the upper portion of the trench 12.

The following effect of the semiconductor memory device having the above structure is obtained.

Since the element isolation region and the capacitor are formed in the trench which is formed around each memory cell and which has a width of 1 $\mu$m or less, so that the widths of the element isolation region and the capacitor can be decreased. The miniaturizing and the packing density of the memory device can be greatly improved. In particular, since the element isolation insulating film is formed on most of the inner surface of the trench, bit information interference can be prevented between the adjacent wall surfaces of the two adjacent cells. One electrode of the capacitor which is formed on the insulating film is directly formed on the semiconductor substrate through the window formed on the wall surface of the trench. The capacitor can therefore be electrically connected to other elements constituting the memory cell in the trench, thereby achieving a high packing density. In the above embodiment, since the n+-type diffusion layer as the drain or source is formed on part of the side wall surfaces of the trench, the area of the n+-type diffusion layer can be greatly decreased.

A method of manufacturing the semiconductor memory device having the structure of FIGS. 3A to 5 will be described with reference to Example 1 of FIGS. 6A to 6P.

EXAMPLE 1

Figure 6A:
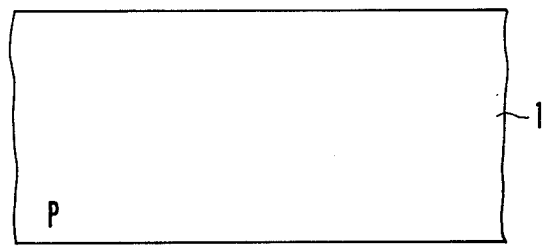
FIGS. 6A to 6P are respectively sectional views for explaining the steps in manufacturing the semiconductor memory device shown in FIG. 3B.
Figure 6B:
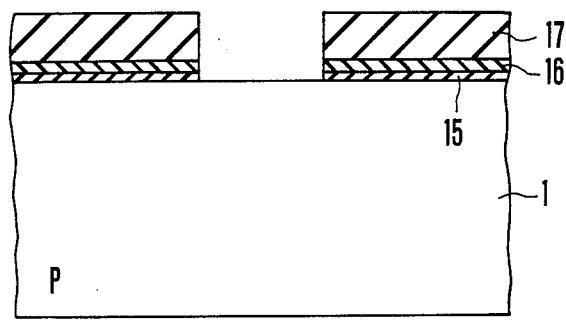

As shown in FIG. 6A, a p-type silicon substrate having an impurity concentration of $10^{15}$ to $10^{16}$ cm$^{-3}$ is prepared. As shown in FIG. 6B, the silicon oxide film 15 is formed by thermal oxidation on the p-type silicon substrate 1 to a thickness of 300 to 500 Å, and a silicon nitride film 16 and a silicon oxide film 17 are respectively deposited by CVD on the silicon oxide film 15 to thicknesses of 1,000 to 1,500 Å and 5,000 to 10,000 Å. The silicon oxide film 17, the silicon nitride film 16 and the silicon oxide film 15 are sequentially etched by reactive ion etching (to be referred oo as RIE hereinafter) using a photoresist pattern (not shown) as a mask and CF$_4$ and hydrogen gas mixture as an etchant (FIG. 6B).

After the photoresist pattern is removed, the silicon substrate 1 is etched by RIE using the films 15, 16 and 17 as masks. In this case, an etchant is CBrF$_3$ gas. As a result, a trench 12 is formed, as shown in FIG. 6C.

The trench 12 has a width of 0.5 to 1 $\mu$m and a depth of about 2 to 4 $\mu$m.

Figure 6C:
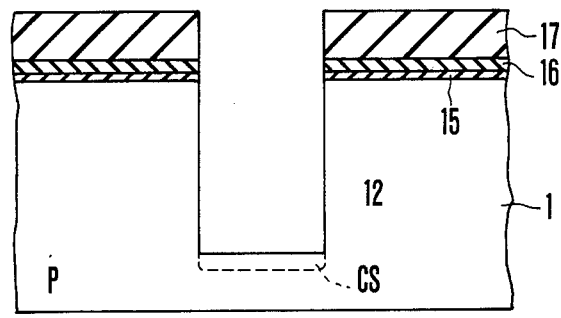

After the trench 12 is formed, boron may be ion-implanted in the bottom of the trench to form a channel stopper CS as indicated by the broken line in FIG. 6C.

Figure 6D:
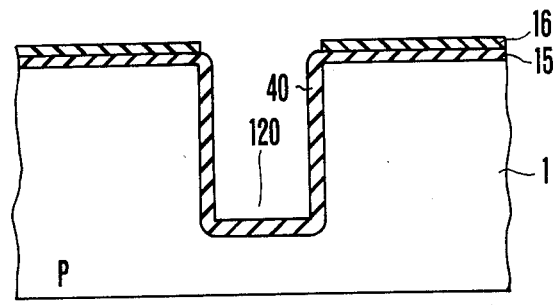

The silicon oxide film 17 is then removed by a buffered hydrofluoric acid solution, and the exposed surface of the silicon substrate 1 may be etched by 500 Å by a mixture of nitric acid and hydrofluoric acid, thereby removing the damaged layer and contamination which may be caused by RIE. Thereafter, a silicon oxide film 40 is formed by thermal oxidation on the inner surface of the trench 12 to a thickness of 500 to 2,000 Å (FIG. 6D). In this case, the remaining trench is designated by reference numeral 120.

Figure 6E:
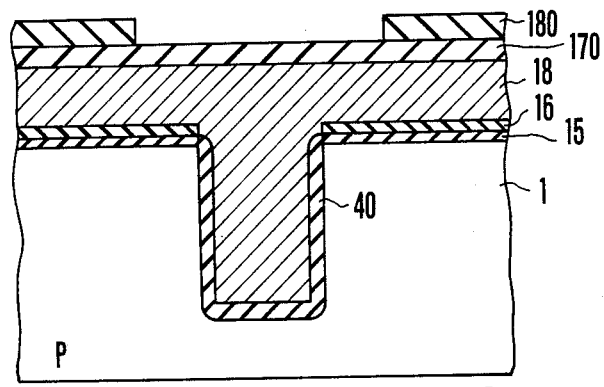

A photoresist film 18 is applied to a thickness of about 1.5 to 2 $\mu$m to bury the trench 120. A silicon oxide film 170 is then formed by electron cyclotron resonance (ECR) deposition method on the photoresist film 18 to a thickness of about 0.1 to 0.3 $\mu$m at a low temperature such as room temperature. A photoresist film 180 is formed on the silicon oxide film 170 and is patterned (FIG. 6E).

In this case, patterning is performed such that only the photoresist film on a portion in which the window 14 is to be formed as a contact hole for connecting the n+-type diffusion layer 62 of the transistor and one electrode of the capacitor is removed. FIG. 6E is a sectional view showing the trench portion including the portion corresponding to the window 14. It should be noted that only the sectional view of the trench portion is illustrated up to FIG. 6P.

Figure 6F:
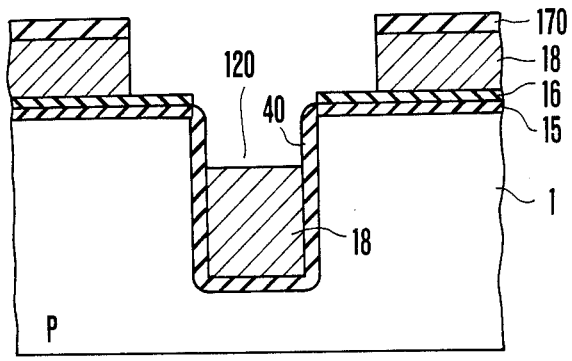

The silicon oxide film 170 is etched by RIE using the photoresist pattern 180 as a mask and CF$_4$ gas as an etchant. Subsequently, the photoresist film 18 is etched by RIE using the silicon oxide pattern 170 as a mask and oxygen gas as an etchant to a depth of 0.1 to 0.8 $\mu$m from the upper end of the trench, thereby exposing partially the silicon oxide film 40 (FIG. 6F). A trench which is not associated with the formation of the window 14 is filled with the photoresist film 18.

Figure 6G:
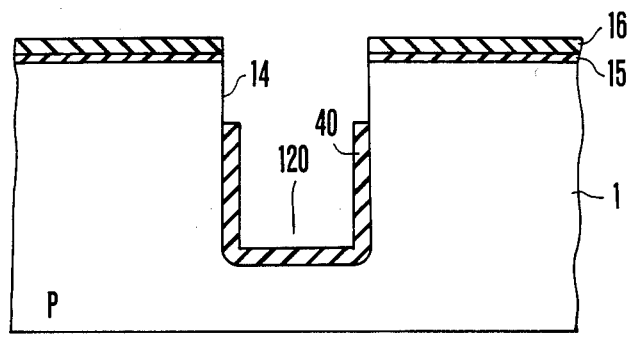

The exposed silicon oxide film 40 is etched using the buffered hydrofluoric acid solution to expose the silicon substrate, thereby forming a window 14 at the upper portion of the trench 120. The photoresist film 18 and the silicon nitride film 16 are used as masks. The silicon oxide film 170 and the photoresist film 18 are respectively removed by RIE using CF$_4$ and hydrogen gases and by an etching technique using oxygen gas (FIG. 6G). The trench with no window 14 is exposed such that the side wall surfaces and the bottom thereof are covered with the silicon oxide film 40.

A thin silicon film 13 doped with an n-type impurity such as phosphorus or arsenic having a concentration of $10^{18}$ to $10^{20}$ cm$^{-3}$ is deposited by CVD to cover the entire surface of the resultant structure. In this case, the CVD process is performed such that silane is used as a source gas and that the silicon substrate is heated at a temperature of about 600° to 700° C., thereby forming a thin polysilicon film. However, the thin silicon film may comprise single crystalline, polycrystalline or amorphous silicon. It is essential to provide a conductive layer which is properly connected to the n+-type diffusion layer 62 shown in FIG. 5. Therefore, silicon may be replaced with a refractory metal (e.g., tungsten or molybdenum) or a silicide thereof.

Figure 6H:
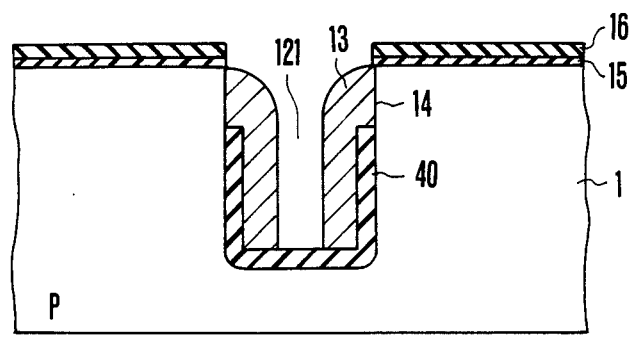

The thickness of the thin silicon film 13 is less than half of the width of the trench so as not to completely fill the trench 120. The thin silicon film 13 is etched by RIE using CBrF$_3$ gas, thereby leaving residual thin silicon films 13 on the side wall surfaces of the trench 120 (FIG. 6H). The trench with no window 14 is covered with the silicon oxide film 40 at a portion corresponding to the window 14, and any other structure is the same as described above.

Figure 6I:
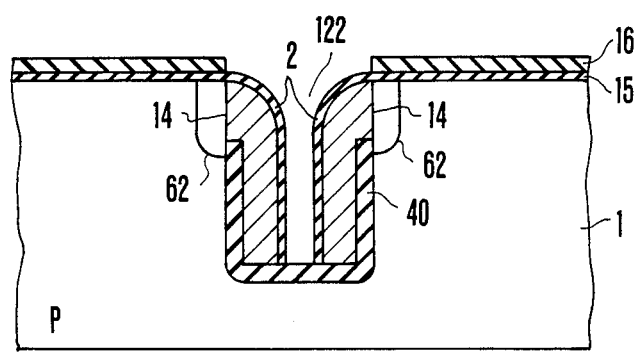

By removing the contamination and the damaged layer which may be caused by RIE, the surface of the residual thin silicon layers 13 are etched by a mixture of nitric acid and hydrofluoric acid to a thickness of 500 Å. Thin insulating films 2 are respectively formed on the residual thin silicon layers 13 to a thickness of 50 to 500 Å (FIG. 6I). The resultant trench is designated by reference numeral 122. The trench with no window 14 is covered with the silicon oxide film 40 at a portion corresponding to the window 14, and any other structure is the same as described above.

In this case, the thin insulating film 2 comprises a silicon oxide film obtained by thermally oxidizing the thin silicon film or a two-layer structure consisting of such a silicon oxide film and a silicon nitride film obtained by CVD.

In the windows 14 where the residual thin silicon films 13 contact the silicon substrate 1 as a result of thermal oxidation, impurities are diffused from the films 13 to form n$^+$-type diffusion layers 62 serving as drains or sources of the transistors TR. A junction depth (lateral depth) of each n$^+$-type diffusion layer 62 is about 0.1 to 0.2 $\mu$m. When such a junction depth cannot be obtained in accordance with the thermal oxidation conditions described above, the thin insulating films 2 are formed and then thermally oxidized in a nitrogen atmosphere.

Figure 6J:
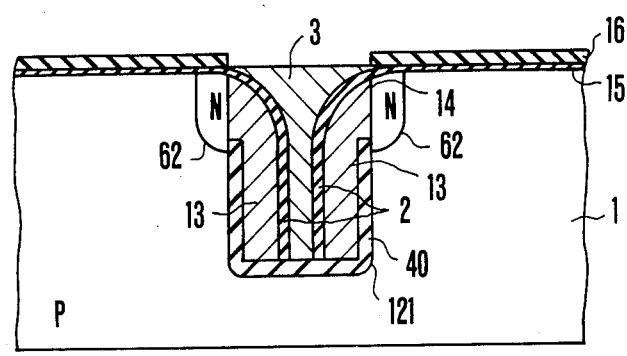

A phosphorus-doped thin silicon film 3 as a thin conductive film is formed to a thickness which is larger than half of the width of the trench 122, thereby filling the trench 122. The thin silicon film 3 is etched by RIE to leave the thin silicon film 3 in only the trench 122 (FIG. 6J). The trench with no window 14 is covered with the silicon oxide film 40 at a portion corresponding to the window 14, and any other structure is the same as described above.

In this case, the conditions for forming the thin silicon film 3 and the RIE conditions are the same as those of forming the thin silicon film 13.

Figure 6K:
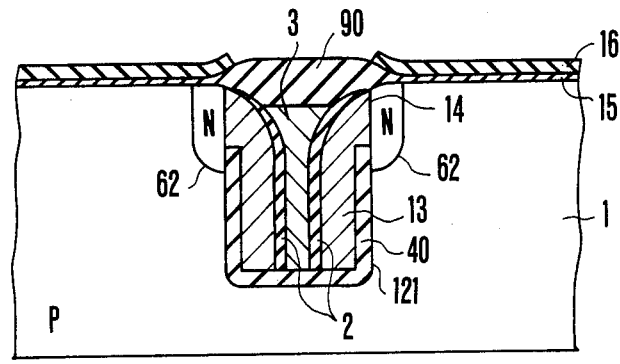

The surface layer of the thin silicon film 30 is thermally oxidized to form a silicon oxide film 90 having a thickness of about 1,000 to 3,000 Å (FIG. 6K). The trench with no window 14 is covered with the silicon oxide film 40 at a portion corresponding to the window 14, and any other structure is the same as described above.

The trench is filled by the thin silicon film 3 which is electrically insulated by the silicon oxide film 90, the thin insulating films 2 and the silicon oxide film 40. The silicon film 3 is connected to the voltage supply at predetermined region.

Figure 6L:
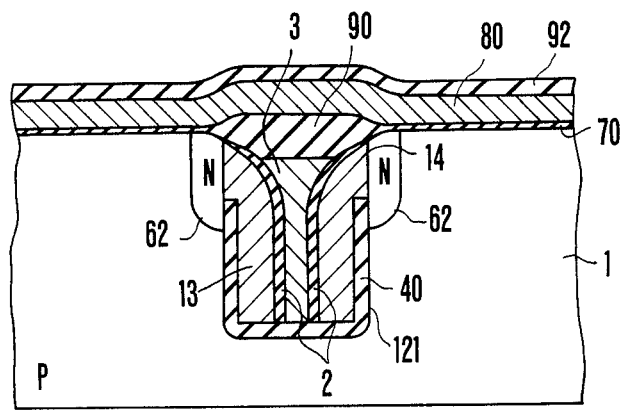

The silicon nitride film 16 is removed by phosphoric acid heated to a temperature of about 160° C., and the silicon oxide film 15 is removed by the buffered hydrofluoric acid solution. The silicon substrate 1 is thermally oxidized to form a silicon oxide film 70 (corresponding to the film 7 in FIGS. 3A to 5) of 50 to 500 Å thickness as a gate insulating film of the transistor. A phosphorus-doped thin silicon film 80 (corresponding to the film 8 in FIGS. 3A to 5) is formed as a gate electrode on the gate insulating film to a thickness of 2,000 to 4,000 Å. The thin silicon film 80 can be formed in the same manner as the thin silicon film 3. A silicon oxide film 92 is formed by CVD on the thin silicon film 80 to form an insulating interlayer having a thickness of 4,000 to 6,000 Å (FIG. 6L). The trench with no window 14 is covered with the silicon oxide film 40 at a portion corresponding to the window 14, and any other structure is the same as described above.

Figure 1:
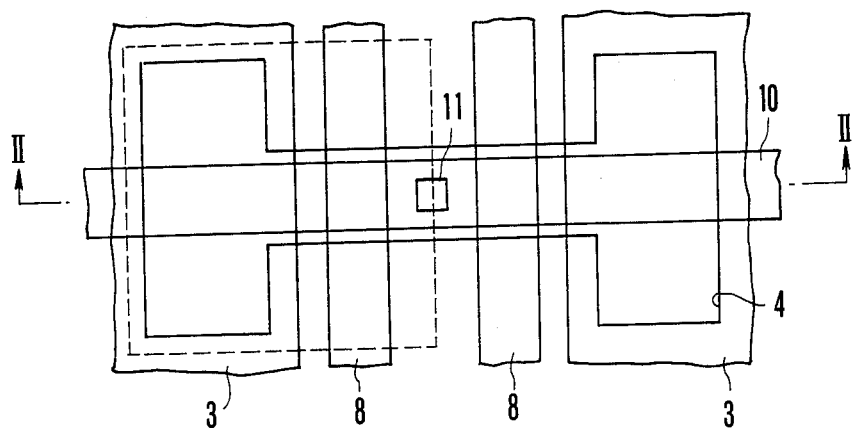
FIG. 1 is a plane view of a typical conventional semiconductor memory device.
Figure 2:
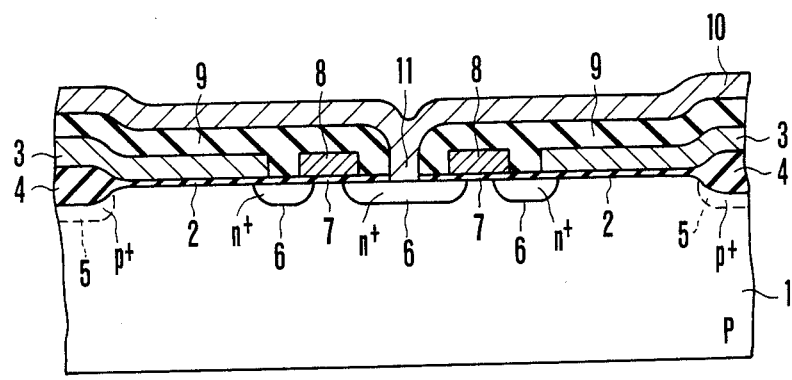
FIG. 2 is a sectional view of the device taken along the line II—II of FIG. 1.
Figures 1, 6M:
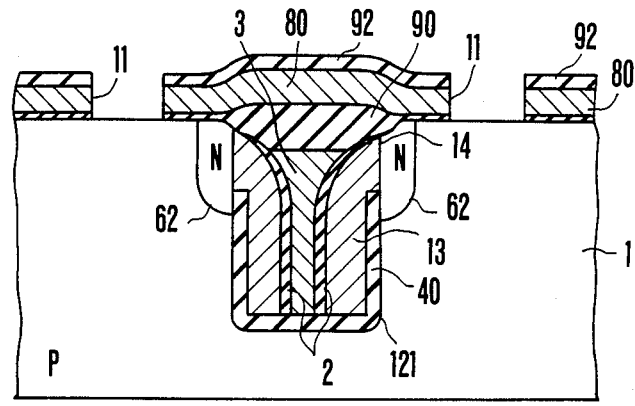

The silicon oxide film 92 and the thin silicon film 80 are etched by RIE using a photoresist pattern (not shown) to form word lines and the contact holes 11 (FIG. 6M-1). In this case, the portion corresponding to the line IV—IV of FIG. 3B is illustrated in FIG. 6M-2.

Figure 6N:
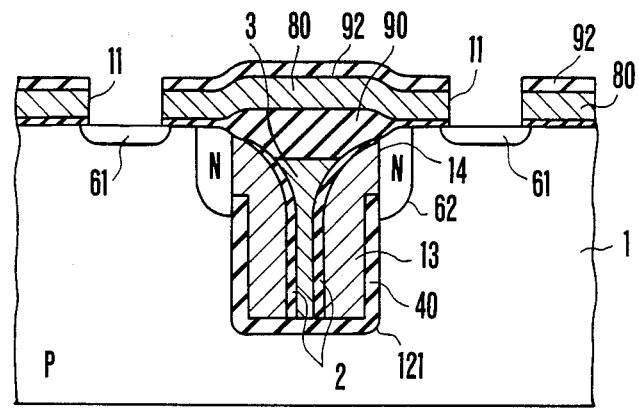
Figures 2, 6M:
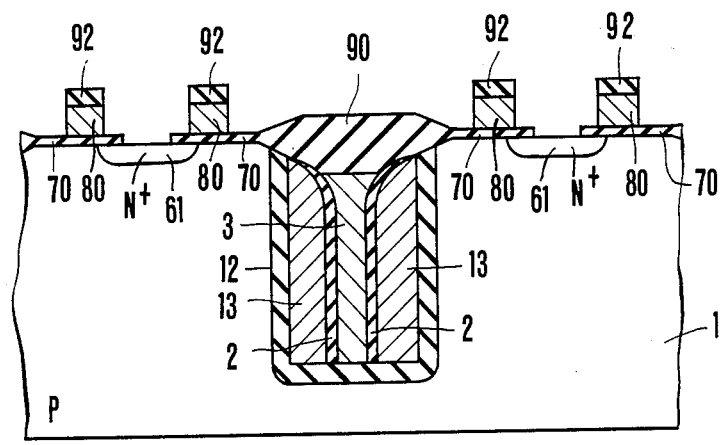

Arsenic is ion-implanted in the exposed portions of the silicon substrate 1 through the contact holes 11 to form the n$^+$-type diffusion layers 61 (FIG. 6N).

Figure 6O:
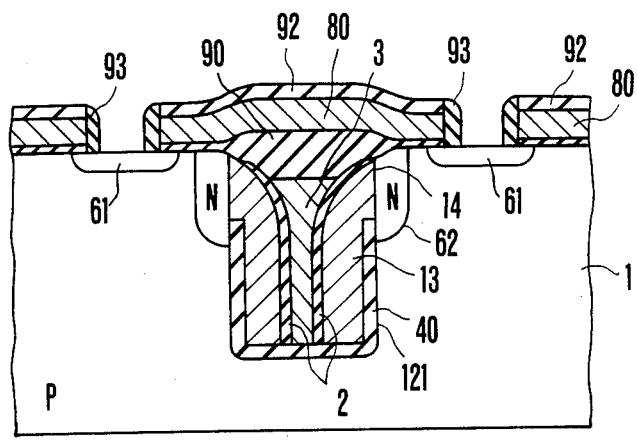

A silicon oxide film 93 is deposited by CVD and etched to leave residual silicon oxide films 93 on only the side wall surfaces of the silicon oxide film 92 and the silicon film 80 (FIG. 6O).

Figure 6P:
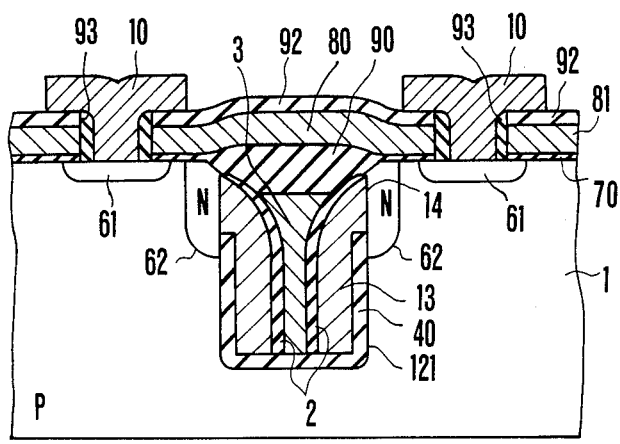

Bit lines 10 are formed by a metal such as aluminum (FIG. 6P). FIG. 6P corresponds to FIG. 5. The portion shown in FIG. 6M-2 after the steps of FIGS. 6N to 6P corresponds to that in FIG. 4.

The semiconductor memory device having the structure shown in FIGS. 3A to 5 is thus prepared.

EXAMPLE 2

Only the trench for forming the window 14 will be described in Example 2. In Example 1, the silicon oxide film 40 is formed by thermal oxidation on the inner wall surface of the trench 12, as shown in FIG. 6D. A process will be described hereinafter wherein a silicon oxide film 41 is formed by CVD in addition to silicon oxide film 40. The structure shown in FIG. 6D is obtained by the method used in Example 1. In this case, a thickness of the silicon oxide film 40 formed by thermal oxidation can be 200 to 700 Å which is smaller than that of the film 40 in Example 1.

A silicon oxide film 41 is then deposited by CVD on the inner wall surface of the trench and the silicon nitride film 16 to a thickness of 500 to 2,000 Å (FIG. 7A).

The silicon oxide films 40 and 41 are etched by the buffered hydrofluoric acid solution so as to expose the silicon substrate and hence obtain the windows 14 as described in Example 1. As a result, a structure is obtained as shown in FIG. 7B.

By using the process in Example 1, residual thin silicon films 13 and residual thin insulating films 2 are on the side wall surfaces of the trench. A phosphorus-doped thin silicon film 3 as a thin conductive film is filled in the trench and is then etched by RIE (FIG. 7C).

The CVD-SiO$_2$ film 41 is removed by the buffered hydrofluoric acid solution from the silicon nitride film 16 to obtain the structure which has the CVD silicon oxide film 41 laminated on the silicon oxide film 40 of the structure shown in FIG. 6J. The following steps are the same as those in Example 1.

EXAMPLE 3

In order to form the windows 14 at the upper portions of the side wall surfaces of the trench in Examples 1 and 2, the photoresist film filled in the trench is etched to a depth corresponding to the size of each window 14 and the silicon oxide film is removed. However, in Example 3, the thick silicon oxide film is not preformed at a region corresponding to the window.

The structure shown in FIG. 6B is obtained in accordance with the process of Example 1. The silicon substrate 1 is etched by RIE using the films 17, 16 and 15 as masks and CBrF$_3$ gas as etchant to form a trench 121. The trench 121 has a width of 0.5 to 1.0 µm and a depth of about 0.2 to 0.5 µm. The silicon substrate surface in the trench is etched by a mixture of nitric acid and hydrofluoric acid to a depth of 500 Å. A silicon oxide film 151 is formed by thermal oxidation to the inner surface of the trench 121 to a thickness of 300 to 500 Å. A silicon nitride film 161 is formed on the silicon oxide film 151 to a thickness of 1,000 to 1,500 Å (FIG. 8A).

Figure 8D:
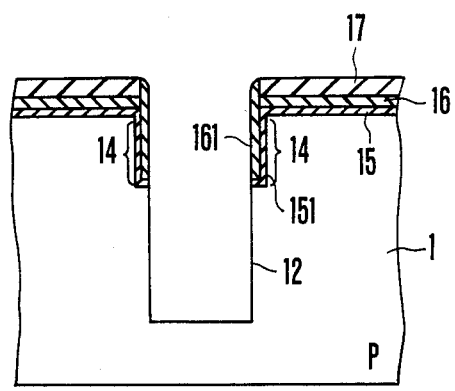

A photoresist film 18 is coated to a thickness of 1.5 to 2 µm to fill the trench 121. A silicon oxide film 170 having etching selectivity with respect to the photoresist film is formed by ECR deposition method on the entire surface to a thickness of 0.1 to 0.3 µm. A photoresist film 180 is applied to the entire surface of the silicon oxide film 170 and is patterned (FIG. 8B). The opening of the photoresist pattern corresponds to a portion excluding the window 14 shown in FIGS. 3A to 5. The photoresist film is not present in the trench with no window 14. It should be noted that the sectional views in FIGS. 8C to 8F illustrate only trenches wherein the windows 14 are to be formed.

The silicon oxide film 170 is etched by RIE using the photoresist pattern 180 as a mask and CF$_4$ gas as an etchant, and the photoresist film 18 is etched by RIE using the residual oxide film pattern 170 as a mask and oxygen gas as an etchant. After the silicon oxide film 170 is removed, the silicon nitride film 161 is etched by plasma etching using the photoresist film 18 as a mask (FIG. 8C). The silicon nitride film 161 in the trench with no window 14 is completely removed in the above step.

Instead of using the silicon oxide film 170 and the photoresist film 180, a photoresist film having a resistance to oxygen plasma, e.g., silicon-contained resist may be formed on the photoresist film 18 and may be patterned to expose portions excluding the window 141. The photoresist pattern may be etched by using the resultant pattern as a mask.

After the photoresist film 18 is removed, the silicon nitride film 161 and the silicon oxide film 151 are removed by RIE from the bottom surface of the trench and the silicon oxide film 17. The silicon substrate 1 is etched by RIE using the silicon oxide film 17 and residual silicon nitride film 161 as masks and CBrF$_3$ as an etchant, thereby obtaining a trench 12 having a depth of 2 to 4 µm (FIG. 8D). The silicon oxide film 151 is left on the side wall surfaces of the trench with no window 14 in this step, thereby forming a trench having a depth of 2 to 4 µm.

Figure 8E:
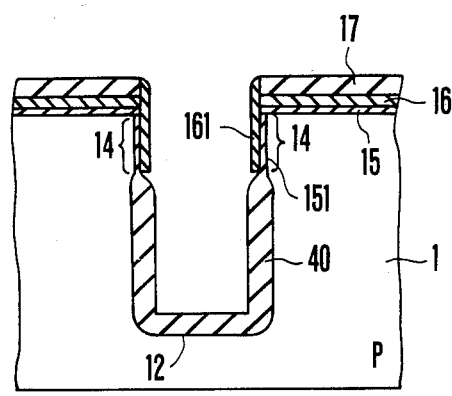

A silicon oxide film 40 is formed by thermal oxidation to a thickness of 1,000 to 3,000 Å in accordance with the silicon oxide and nitride films 16 and 161 as masks (FIG. 8E). The thick silicon oxide film is formed on the entire side wall surfaces and the bottom surface of the trench with no window 14.

Figure 8F:
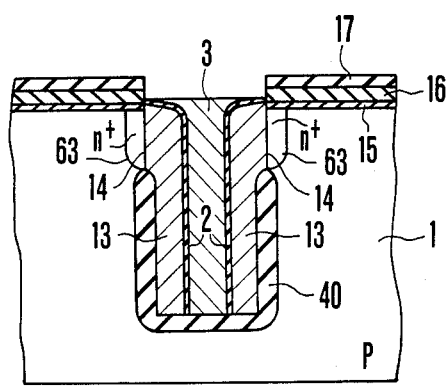

After the silicon nitride film 161 and the silicon oxide film 151 are removed, the residual thin silicon films 13 and the thin insulating films 2 are formed on the side wall surfaces of the trench in accordance with the process of Example 1. Thereafter, a thin conductive film 3 is filled in the trench and is etched by RIE (FIG. 8F).

The CVD-SiO$_2$ film 17 is removed by the buffered hydrofluoric acid solution, and the structure shown in FIG. 6J is obtained. The subsequent steps are the same as those of Example 1.

The following effects in addition to the effects inherent to the structure of the semiconductor memory device described above are obtained by using the above-mentioned process.

The contact holes are formed simultaneously when the gate electrode is formed, and the n$^+$-type diffusion regions as drains or sources are formed throught the contact holes. The gate electrode can be self-aligned; an alignment margin between the gate electrode and the contact hole need not be provided. In addition, the photolithographic process is decreased by one step.

As is apparent from the description, the transistor region can be greatly decreased as compared with that of the conventional semiconductor memory device. Therefore, the area of the memory cell region can be greatly decreased to provide memory cells with a high packing density.

EXAMPLE 4

Figure 9:
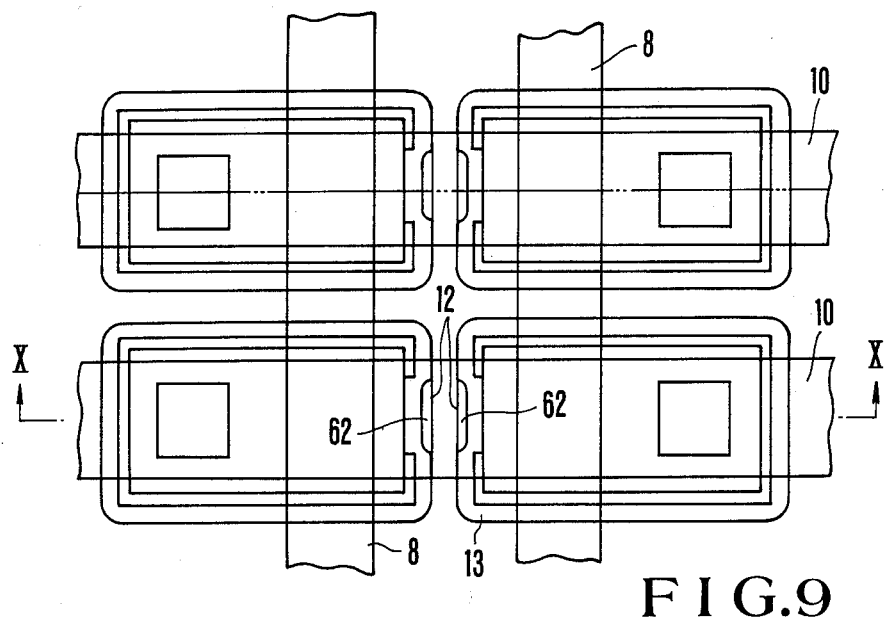
FIG. 9 is a plane view showing a simplified structure of a semiconductor memory device according to another embodiment of the present invention.
Figure 10:
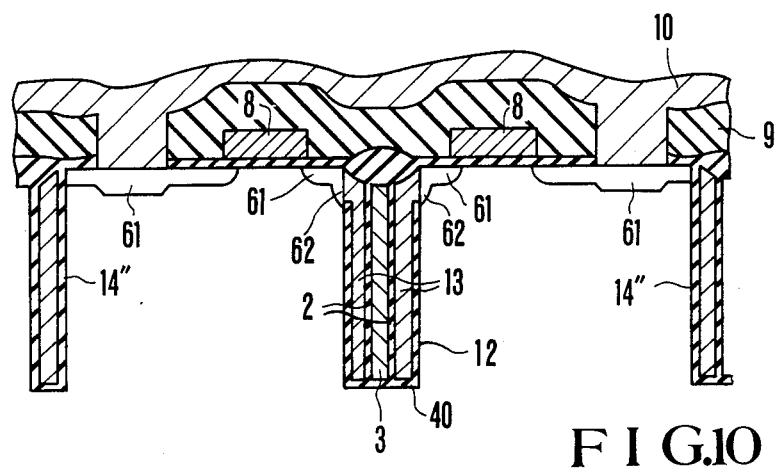
FIG. 10 is a sectional view of the device taken along the line X—X of FIG. 9.

The other cell structure will be exemplified in Example 4. The resultant cell structure is shown in FIG. 9, and its sectional view is illustrated in FIG. 10. In Example 4, the transfer gate length is determined by precision of photolithography and gate electrode patterning. Thermal diffusion conditions and alignment errors of the contact hole 11 hardly cause errors in gate length and gate length can be easily controlled. In addition, the word line is formed between the n$^+$-type diffusion layer 62 and the contact hole, so that the gate area can be decreased, thus resulting in a decrease in parasitic capacitance.

However, according to Example 4, when the electrode 13 is a high level, a channel (an inversion layer) is formed on each side wall surface 14'' of the trench in accordance with a relationship between an impurity concentration of the silicon substrate 1 and a thickness of the silicon oxide film 40. The stored charge is transferred to the bit line through the inversion layer irrespective of the ON/OFF operation of the gate electrode 8.

For example, when an operating voltage of the memory, a substrate voltage, and a thickness of the silicon oxide film 40 are given as 3V, 0V and 1,000 Å, respectively, an impurity concentration of the silicon substrate near the trench wall 14'' must be $1 \times 10^{17}$ cm$^{-3}$ or more to prevent a charge leakage from the capacitor.

When the silicon substrate 1 has the above-mentioned impurity concentration, the presence/absence of the channel stopper does not become an issue. However, in practice, the silicon substrate 1 has an impurity concentration of about $10^{15}$ to $10^{16}$ cm$^{-3}$ since a higher impurity concentration causes a decrease in breakdown voltage of the p-n junction and the difficulty of control of a threshold voltage of the transistor.

In this case, it is better to perform channel stopping in the following manner:

(1) An impurity is diffused in a predetermined region of the silicon substrate to increase the impurity concentration of the predetermined region, and a memory cell is formed in this region;

(2) A high-impurity region is formed to cover the entire surface of the trench; and (3) A high-impurity region is formed to a depth larger than a depletion layer of the adjacent drain.

Figure 11A:
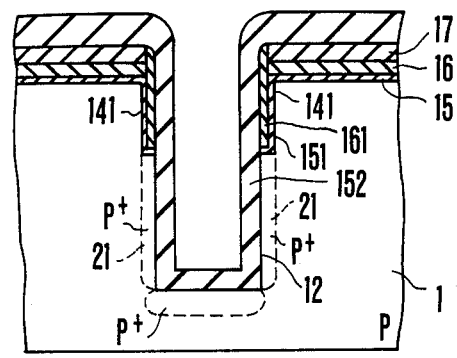
FIGS. 11A and 11B are respectively sectional views for explaining the steps in forming a channel stopper on the side wall surfaces of the trench.

Method (1) can be practiced by a known well formation technique. A case will be described with reference to FIGS. 11A and 11B wherein method (2) is applied to Example 3. FIG. 11A is a sectional view of a structure including the windows 141, and FIG. 11B is a sectional view of a structure excluding the windows 141.

A silicon oxide film 152 containing a p-type impurity such as boron is deposited on the entire surface of the resultant structure. The p-type impurity is diffused by annealing from the silicon oxide film 152 to the silicon substrate at the trench 12, thereby forming a p+-type layer 21.

Figure 11B:
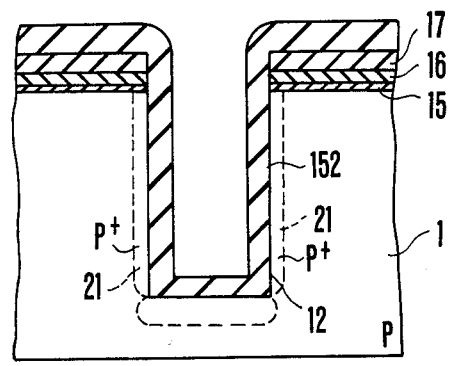

The p+-type layer 21 is formed in the inner surface of the trench which excludes the windows 141 in FIG. 11A, and the p+-type layer 21 is formed in the entire inner surface of the trench in FIG. 11B.

The silicon oxide film 152 is removed by the buffered hydrofluoric acid solution. The subsequent steps to that of FIG. 11E will be performed.

Figure 12:
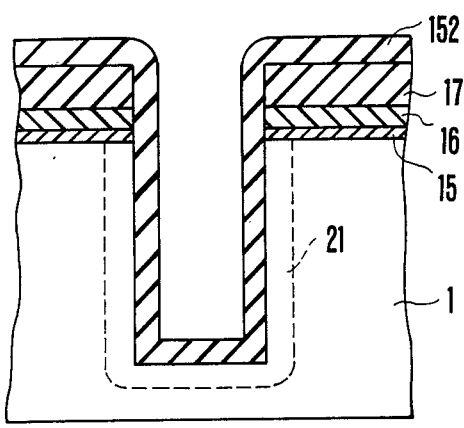
FIG. 12 is a sectional view showing a modification of forming a channel stopper.

In Example 1 or 2, after the steps up to that of FIG. 6C are performed, a boron-doped silicon oxide film 152 is deposited and annealed to form the p+-type layer 21 (FIG. 12).

The silicon oxide films 152 and 17 are removed by the buffered hydrofluoric acid solution, and the steps from that of FIG. 6D will be performed.

Figure 13A:
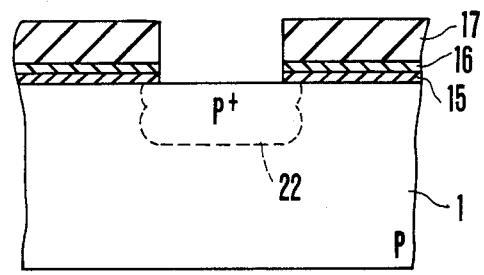

A case will be described with reference to FIGS. 13A, 13B-1, 13B-2 and 14 wherein a high impurity layer is formed to a depth larger than that of the n+-type diffusion layer 62 so as to apply method (3) to Example 3. After the step in FIG. 6B is completed, a p-type impurity such as boron is ion-implanted in the substrate. This ion implantation is effectively performed b changing implantation energy levels in two or more steps. For example, when boron ions are implanted at an acceleration voltage of 50 keV and 100 keV, a p+-type layer 22 can be formed to a depth of about 0.4 $\mu$m. The p+-type layer 22 can be formed by ion implantation and subsequent annealing to extend under the silicon oxide film 17, the silicon nitride film 16 and the silicon oxide film 15 as the masks (FIG. 13A). For this reason, when the trench 12 is formed in the steps shown in FIGS. 8A to 8D, the p+-type layers 22 are left on the upper portions of the side wall surfaces of the trench.

Figures 1, 13B:
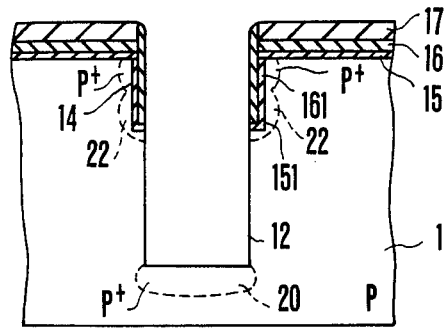
Figures 2, 13B:
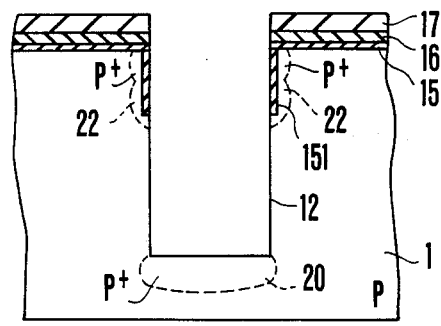

Boron is then ion-implanted in the bottom at an acceleration voltage of 40 keV, and annealing is performed to form a p+-type layer 20 in the trench bottom (FIGS. 13B-1 and 13B-2).

It should be noted that FIG. 13B-1 is a sectional view of a structure including the windows 14 and FIG. 13B-2 is a sectional view of a structure excluding the windows 14.

Figure 14:
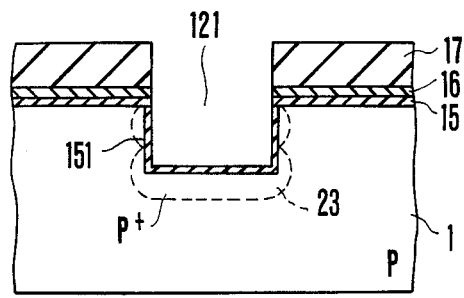

Still another method is proposed wherein boron is ion-implanted at an acceleration voltage of 50 keV after the structure shown in FIG. 6B is obtained. As shown in FIG. 14, a trench 121 is formed, and a silicon oxide film 151 is formed in the trench 121. Boron is ion-implanted at an acceleration voltage of 50 keV to form a p+-type layer 23. The steps from that of FIG. 8A are performed.

Although the p+-type layers have a high impurity concentration, their concentration is about $10^{17}$ cm$^{-3}$ which is lower than that ($10^{20}$ cm$^{-3}$ or more) of the n+-type diffusion layer. No problem therefore occurs during formation of the n+-type diffusion layer.

It should be noted that method (3) can be applied to Examples 1 and 2.

EXAMPLE 5

FIGS. 15, 16, 17 and 18 show a semiconductor memory device according to still another example of the present invention.

Figure 15:
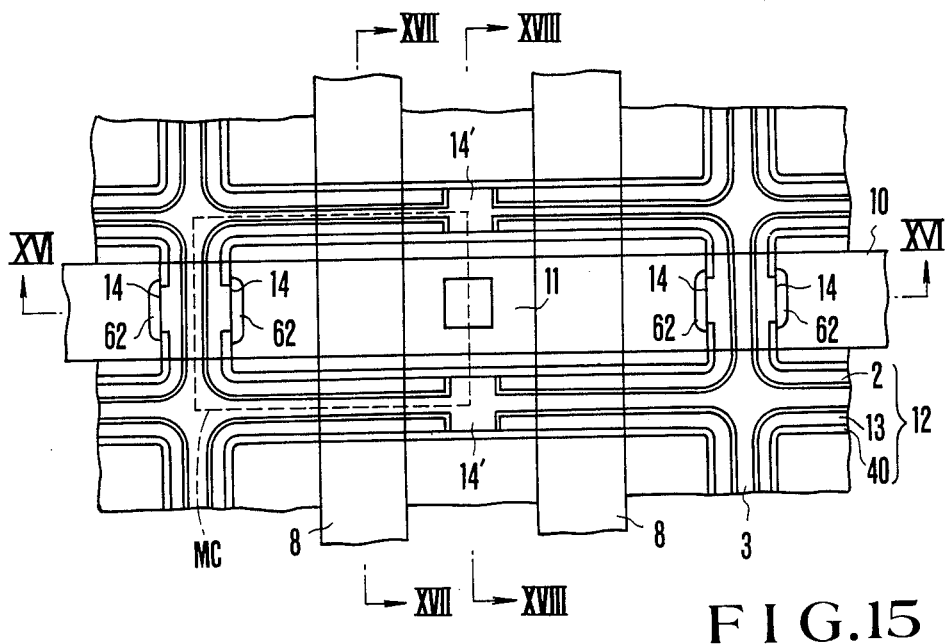
FIG. 15 is a plane view showing a simplified structure of a semiconductor memory device according to still another embodiment of the present invention.
Figure 16:
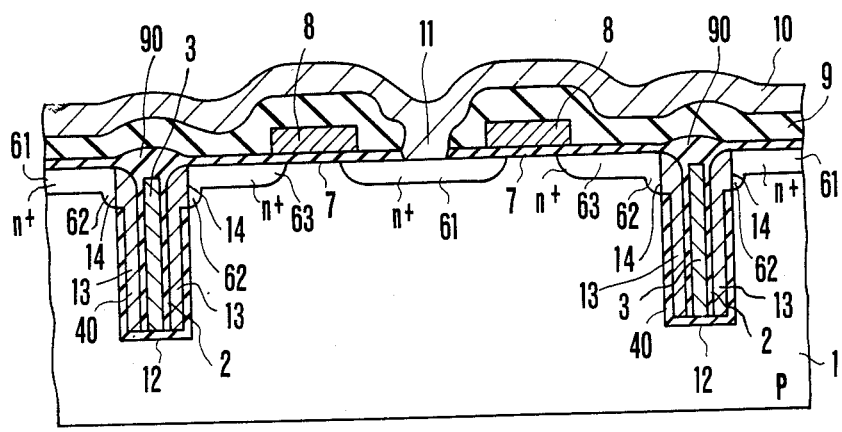
FIG. 16 is a sectional view of the device taken along the line XVI—XVI of FIG. 9.
Figure 17:
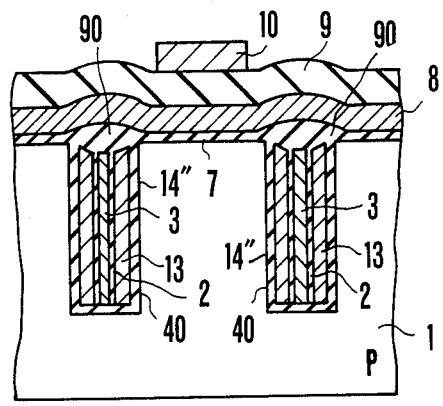
FIG. 17 is a sectional view of the device taken along the line XVII—XVII of FIG. 9.
Figure 18:
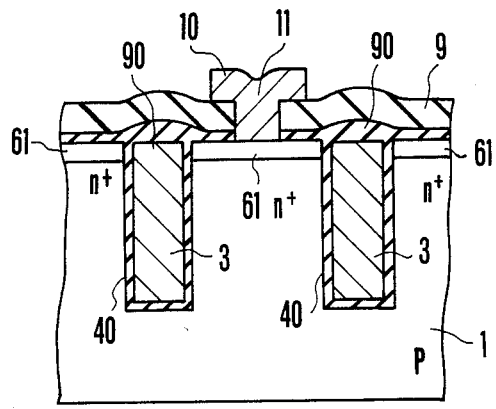
FIG. 18 is a sectional view of the device taken along the line XVIII—XVIII of FIG. 9.

The same reference numerals as in FIGS. 1 and 2 denote the same parts as in FIGS. 15 to 18. A region surrounded by a dotted line corresponds to one memory cell. FIG. 15 shows a horizontal positional relationship between the respective layers, and a vertical positional relationship therebetween is not strictly given in the same manner as in FIG. 3B.

In Example 4, a trench 12 is formed around a pair of memory cells MC having a common contact hole 11. Each capacitor CP comprises a thin n-type silicon film 13 as a lower electrode formed along the inner wall surface of the trench, a thin insulating film 2 and a thin conductive film 3 serving as an upper electrode.

A transistor TR comprises an n+-type diffusion layer 61 and 62, a gate insulating film 7, and a gate electrode 8 serving as a word line. The structure of the transistor TR is the same as that of the conventional one. However, in the same manner as the previous examples, the n+-type diffusion layer 63 is electrically connected to the thin n-type silicon film 13 at each window 14 through the n+-type diffusion layer 62 obtained by diffusing the impurity from the thin silicon film 13.

The n+-type diffusion layer 61 is connected to a bit line 10 through the contact hole 11, and the bit line 10 and the word line (the gate electrode) 8 are electrically insulated through an insulating interlayer 9. The word line 8 and the thin conductive film 3 as the upper capacitor electrode are electrically insulated through a thin insulating film 90 formed on the upper portion of the trench. The pair of memory cells having the common contact hole 11 are electrically isolated from other cells through a silicon oxide film formed on the inner surface of the trench 12. Charge leakage is prevented between the pair of cells by removing the thin n-type silicon film 13 at a region 14' of the trench as the boundary of the memory cells.

A method of manufacturing the semiconductor memory device shown in FIGS. 15 to 18 will be described with reference to FIGS. 19A and 19B hereinafter.

The structures shown in FIGS. 13B-1 and 13B-2 are obtained by the method of Example 4, and the inner wall of the trench is thermally oxidized by the method of Example 3. Affix 1 of the figure indicates the sectional view of the structure including the windows 14, and affix 2 thereof indicates the sectional view of the structure excluding the windows 14. A thin silicon film 13 containing phosphorus or arsenic is deposited by the method of Example 1 and is etched by RIE to leave residual thin silicon films 13 on only the side walls of the trench 12. The resultant trench is designated by reference numeral 122 (FIGS. 19A-1 and 19A-2).

Then a photoresist film 181 is formed on the whole surface.

The pattern of photoresist film 181 is formed to expose the thin silicon films 13 at the regions 14' in accordance with the method of Example 1 or 3, as shown in FIG. 15. The thin silicon films 13 exposed at the regions 14' are etched by a plasma etching apparatus using CF$_4$ and oxygen gases.

The length of the pattern along a direction perpendicular to the trench can be longer than the width so as to provide a larger margin for alignment with the underlayer.

The sectional view of the structure including the regions 14' in this process is illustrated in FIG. 19B-1, and that without the regions 14' is illustrated in FIG. 19B-2.

After the photoresist films 181 are removed, the same processes (on and after FIG. 6I) as in Example 1 are performed.

Figures 1, 19A:
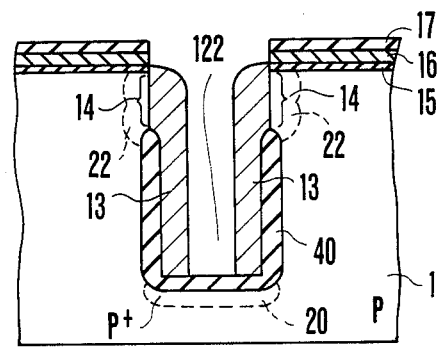

When a material for an upper capacitor electrode is filled as shown in FIG. 19A-1, the material may be formed to a thickness so as to completely cover the trench and the substrate, and thereafter the material may be etched back to expose the surface of the substrate.

According to the embodiment shown in FIG. 15 and subsequent figures, the pair of memory cells adjacent to each other hae a common contact hole. Therefore, the resultant memory device has a higher packing density than that of the memory device shown in FIGS. 3A to 6.

According to the present invention, the surface area of the memory cell can be greatly decreased to obtain a memory device with a high packing density.

The present invention is not limited to the particular embodiments described above. Various changes and modification will be made within the spirit and scope of the invention.

What is claimed is:

1. A semiconductor memory device comprising a semiconductor substrate of a first conductivity in which a plurality of memory cells are formed, each of said plurality of memory cells including at least one capacitor, a switching element and a trench being disposed on a major surface of said substrate, and switching element being disposed on a flat surface of said substrate which is surrounded by said trench, wherein a first insulating film is formed at least on most areas of side wall surfaces of said trench, said capacitor and first insulating film being disposed within a region defined by said trench, said first insulating film having a window near the opening of said trench so that a portion of said substrate is exposed, a diffusion region is formed in a portion of said substrate corresponding to said window, a first conductive film serving as one electrode of said capacitor is formed on said first insulating film and an exposed portion, said exposed portion being disposed in corresponding relationship to said window, said first conductive film and said diffusion region extending into said window and being in contact with one another thereat, wherein among adjacent memory cells, the first conductive film of each adjacent memory cell are disposed upon side wall of said trench and are isolated from one therewithin, and wherein a second insulating film is formed on said first conductive film, a second conductive film serving as the other common electrode of said capacitor of each adjacent memory cell is formed between said first insulating and said second insulating film, at the bottom of said trench so that the first conductive film of each adjacent memory cell is electrically separated from each other by the second insulating films, and wherein one terminal of said switching element contacts to said first conductive film through said window.

2. A device according to claim 1, wherein said trench surrounds one memory cell having one switching element and one capacitor, and said one switching element comprises one metal-insulator-semiconductor field effect transistor, a source region or drain region of said transistor being formed adjacent to the side wall surface of said trench which contacts said first conductive film, and said diffusion region is said source region or drain region.

3. A device according to claim 2, wherein a channel stopper region is formed in a region of said semiconductor substrate which is adjacent to an inner wall surface of said trench.

4. A device according to claim 3, wherein said channel stopper region is formed in a bottom portion of said trench.

5. A device according to claim 4, wherein said channel stopper region is formed in an entire area of said inner wall surface of said trench.

6. A device according to claim 4, wherein said channel stopper region is formed at least at an upper portion of each of said side wall surfaces of said trench.

7. A device according to claim 2, wherein said first conductive film is semiconductive and contains an impurity having a second conductivity.

8. A device according to claim 1, wherein said second insulating film comprises a plurality of insulating films having different dielectric constants.

9. A device according to claim 1, wherein said trench has a depth larger than a width thereof.

10. A device according to claim 1, wherein said trench surrounds a pair of adjacent memory cells, each switching element of said memory cells is metal-insulator-semiconductor field effect transistor, a pair of memory cells commonly use one bit line contact hole, each transistor of said pair of memory cells commonly uses source or drain region which connects to said bit line, each said window of said pair of memory cells locates at a side opposite to said bit line contact hole with respect to a gate lectrode of said transistor of each memory cell, said first conductive film is formed on a predetermined region excluding a boundary of said pair of memory cells on a surface of said first thin insulating film, and said second conductive film is formed on at least said second insulating film and on said first insulating film on a boundary of said pair of memory cells so as to fill said trench.

11. A device according to claim 10, wherein a channel stopper region is formed in a region of said semiconductor substrate which is adjacent to an inner wall surface of said trench.

12. A device according to claim 10, wherein said first conductive film is semiconductive and contains an impurity having a second conductivity type.

* * * * *